United States Patent
Chen et al.

(10) Patent No.: US 9,672,881 B2
(45) Date of Patent: Jun. 6, 2017

(54) MEMORY DEVICE WITH VARIABLE STROBE INTERFACE

(71) Applicant: Macronix International Co., Ltd., Hsinchu (TW)

(72) Inventors: Ken-Hui Chen, Hsin chu (TW); Kuen Long Chang, Taipei (TW); Chin-Hung Chang, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/719,678

(22) Filed: May 22, 2015

(65) Prior Publication Data

US 2015/0340071 A1 Nov. 26, 2015

Related U.S. Application Data

(60) Provisional application No. 62/002,195, filed on May 23, 2014.

(51) Int. Cl.
*G11C 7/22* (2006.01)
*G06F 13/16* (2006.01)

(52) U.S. Cl.
CPC .......... *G11C 7/22* (2013.01); *G06F 13/1689* (2013.01); *G11C 7/222* (2013.01)

(58) Field of Classification Search
CPC ........ G11C 7/22; G11C 7/222; G06F 13/1689
See application file for complete search history.

(56) References Cited

U.S. PATENT DOCUMENTS

| | | | |
|---|---|---|---|
| 7,123,524 B1* | 10/2006 | Han ................... | G11C 7/1051 327/3 |
| 8,856,410 B2* | 10/2014 | Park ................... | G11C 7/222 710/71 |
| 2002/0158669 A1* | 10/2002 | Choi .................. | G11C 7/1078 326/93 |
| 2009/0161455 A1* | 6/2009 | Ku ..................... | G11C 7/1072 365/193 |

* cited by examiner

*Primary Examiner* — J. H. Hur
(74) *Attorney, Agent, or Firm* — Finnegan, Henderson, Farabow, Garrett & Dunner LLP

(57) ABSTRACT

A memory device includes a variable strobe interface configured to select one of a data queue strobe signal or a system clock signal to signal initiation of data receipt at the memory device.

8 Claims, 6 Drawing Sheets

MEMORY DEVICE WITH VARIABLE STROBE INTERFACE

CROSS REFERENCE TO RELATED APPLICATIONS

This application claims priority to provisional application No. 62/002,195, filed on May 23, 2014, the entire contents of which are incorporated herein by reference.

TECHNICAL FIELD

Exemplary embodiments relate to an electronic device and, more particularly, to an electronic device having a memory device with a variable strobe interface.

BACKGROUND

Today many electronic devices include a memory device to store data. Generally, a memory device needs to send or receive a control signal, e.g., a strobe signal, to/from a host device to control the input of data to or the output of data from the memory device. Some memory devices are configured to receive a data strobe signal to initiate a data input or output operation, while other memory devices are configured to initiate a data input or output operation in response to a system clock signal. A memory device may be utilized in a plurality of different host applications and be required to be compatible with different strobe interfaces. Thus, there is a need to effectively manage different strobe interfaces for a memory device.

SUMMARY OF EMBODIMENTS

According to a first aspect of the present disclosure, there is provided a memory device. The memory device includes a variable strobe interface configured to select one of a data queue strobe signal or a system clock signal to signal initiation of data receipt at the memory device.

According to a second aspect of the present disclosure, there is provided an electronic device. The electronic device includes a controller; a memory device; a data queue strobe bus disposed between the controller and the memory device; one or more conductors of a data queue bus disposed between the controller and the memory device; a clock bus coupled to the controller and the memory device; and a variable strobe interface disposed between the controller and the memory device and coupled to the data queue strobe bus and the clock bus. The variable strobe interface is configured to select one of a data queue strobe signal transmitted on the data queue strobe bus or a system clock signal transmitted on the clock bus to signal initiation of data receipt at the memory device on one or more of the conductors of the data queue bus.

BRIEF DESCRIPTION OF THE DRAWINGS

Reference will now be made, by way of example, to the accompanying drawings which show exemplary embodiments of the present application, and in which.

DESCRIPTION OF EXAMPLE EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Figure 1:
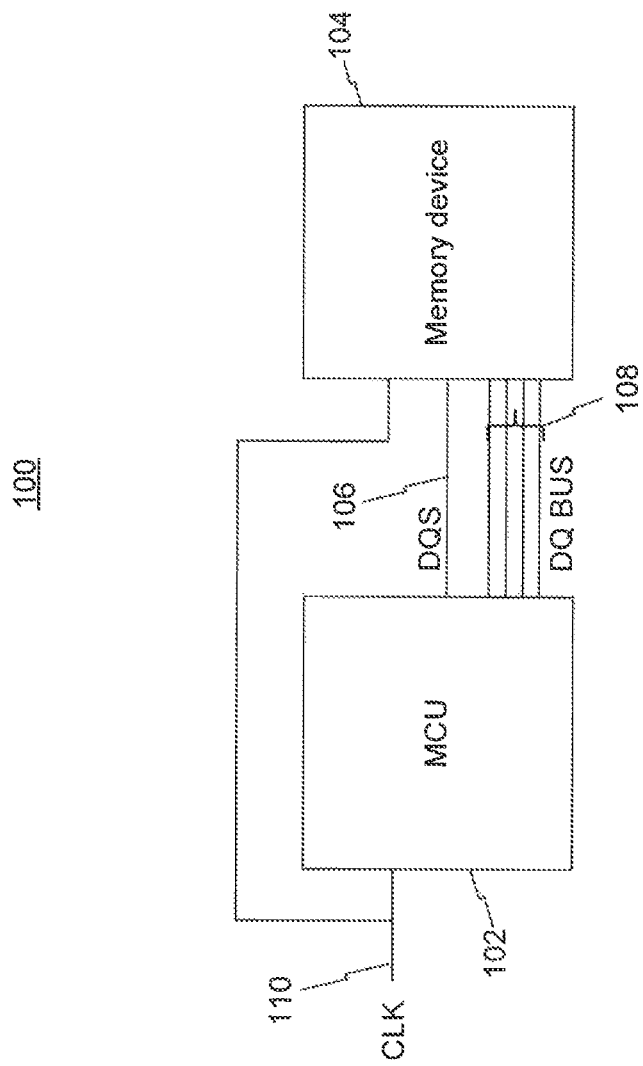
FIG. 1 shows a schematic diagram of an electronic device.

FIG. 1 depicts an exemplary electronic device 100. Electronic device 100 includes a microcontroller unit (MCU) 102, a memory device 104, a data queue strobe (DQS) bus 106, one or more conductors of a data queue (DQ) bus 108, and a clock bus 110. Although four conductors of DQ bus 108 are shown in FIG. 1, the number is not limited. MCU 102 receives a system clock signal CLK from clock bus 110. As shown in FIG. 1, DQS bus 106 and four conductors of DQ bus 108 are coupled between MCU 102 and memory device 104. Memory device 104 also receives the system clock signal CLK from clock bus 110.

Figure 2A:
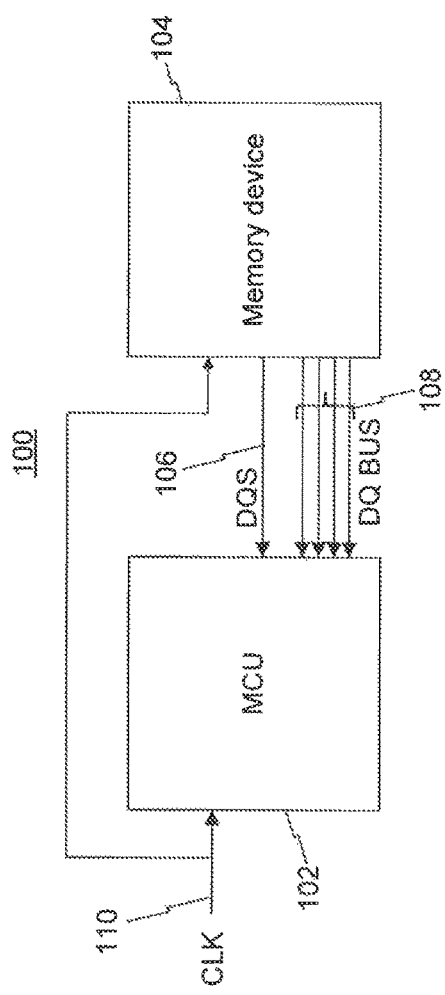
FIG. 2*a* shows a schematic diagram of an electronic device in which data is output from a memory device to a microcontroller unit.
Figure 2B:
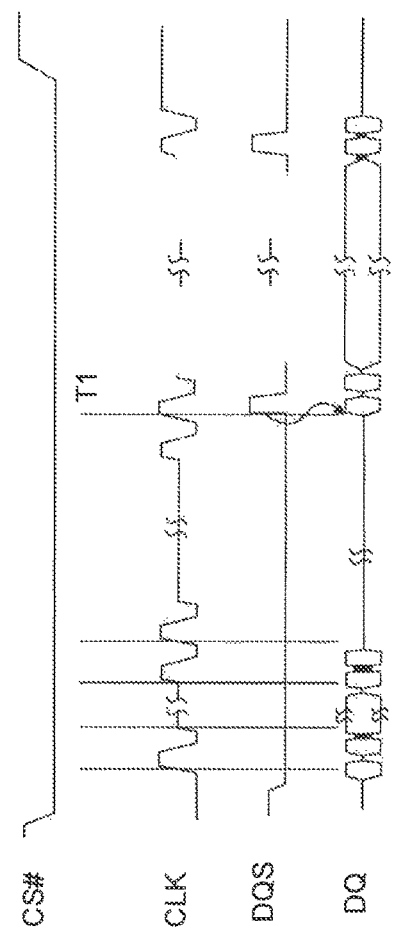
FIG. 2*b* shows a schematic waveform diagram consistent with an operation of the electronic device in FIG. 2*a*.

FIG. 2*a* shows an exemplary operation of electronic device 100 in which memory device 104 outputs data to MCU 102. Referring to FIG. 2*a*, MCU 102 and memory device 104 receive system clock signal CLK from clock bus 110. Memory device 104 outputs data and a DQS signal to MCU 102 via one or more conductors of DQ bus 108 and DQS bus 106, respectively. For example, referring to FIG. 2*b*, at time T1, memory device 104 outputs a DQS signal via DQS bus 106 to MCU 102, to signal initiation of the data output from memory device 104 to MCU 102.

Figure 3A:
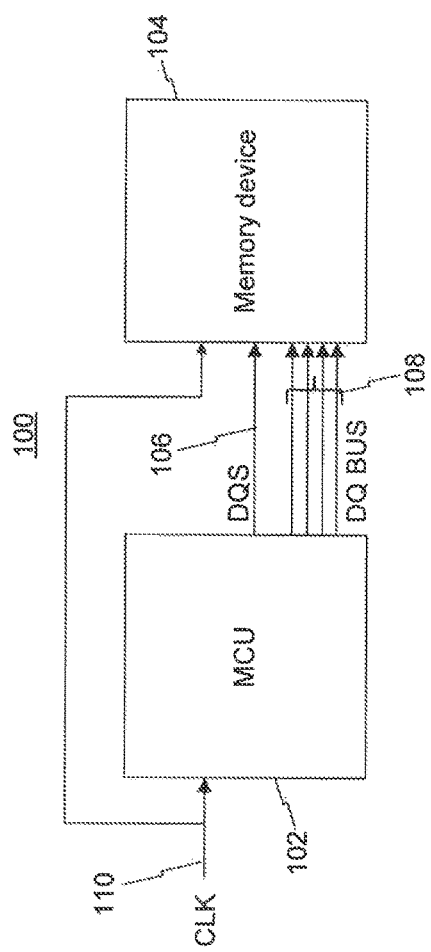
FIG. 3*a* shows a schematic diagram of an electronic device in which data is output from a microcontroller unit to a memory device.

FIG. 3*a* shows another exemplary operation of electronic device 100 in which MCU 102 issues a command or sends data for storage to memory device 104. Referring to FIG. 3*a*, MCU 102 and memory device 104 receive system clock signal CLK from clock bus 110. MCU 102 outputs a command or sends data for storage to memory device 104 via one or more conductors of DQ bus 108 and a DQS signal via DQS bus 106. Further, referring to FIG. 3*b*, at time T2, MCU 102 sends to memory device 104 the DQS signal via DQS bus 106, to signal initiation of the command or data output from MCU 102 to memory device 104.

Figure 4A:
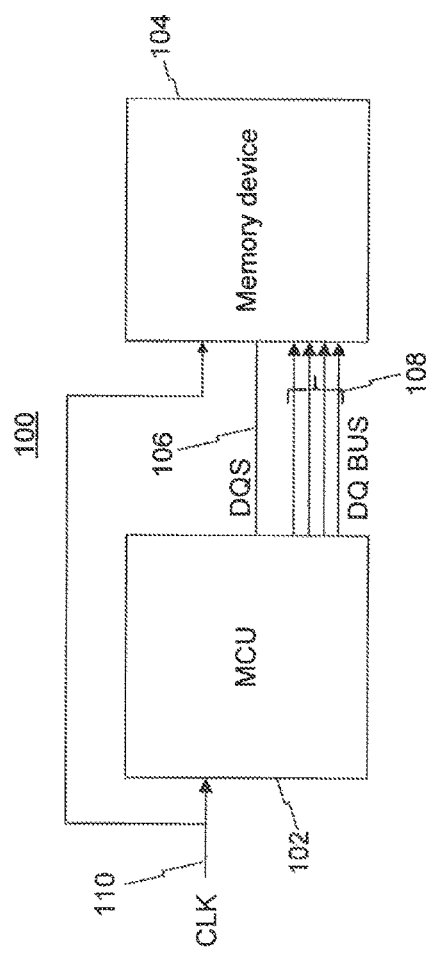
FIG. 4*a* shows a schematic diagram of an electronic device in which data is output from a microcontroller unit to a memory device.

FIG. 4*a* shows another exemplary operation of electronic device 100 in which MCU 102 issues a command or sends data to memory device 104. Referring to FIG. 4*a*, MCU 102 and memory device 104 receive system clock signal CLK from clock bus 110. MCU 102 outputs a command or sends data for storage to memory device 104 via one or more conductors of DQ bus 108. However, MCU 102 does not output a DQS signal to signal the initiation of the command or data output. Instead, referring to FIG. 4b, at time T3, the system clock signal CLK received at memory device 104 is used to signal the initiation of the command or data output from MCU 102 to memory device 104.

Figure 3B:
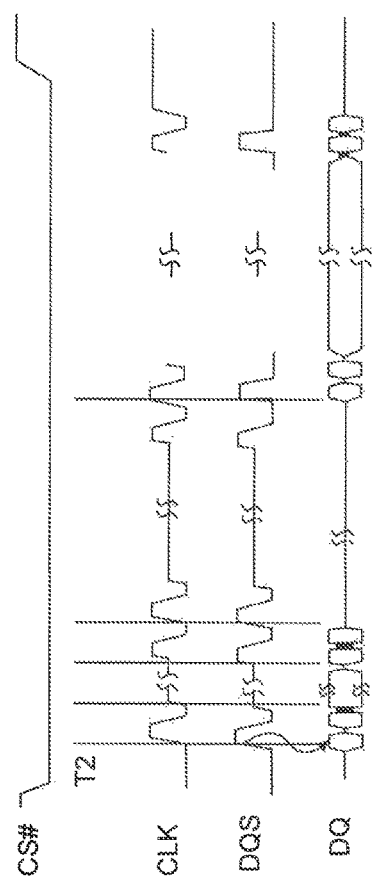
FIG. 3*b* shows a schematic waveform diagram consistent with an operation of the electronic device in FIG. 3*a*.
Figure 4B:
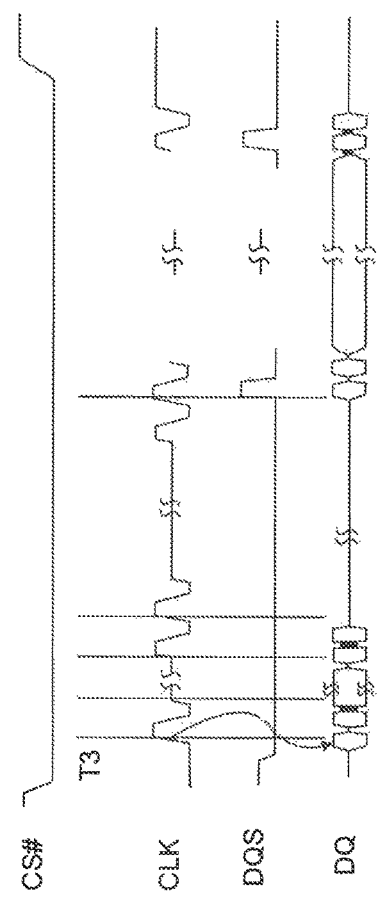
FIG. 4*b* shows a schematic waveform diagram consistent with an operation of the electronic device in FIG. 4*a*.
Figure 5:
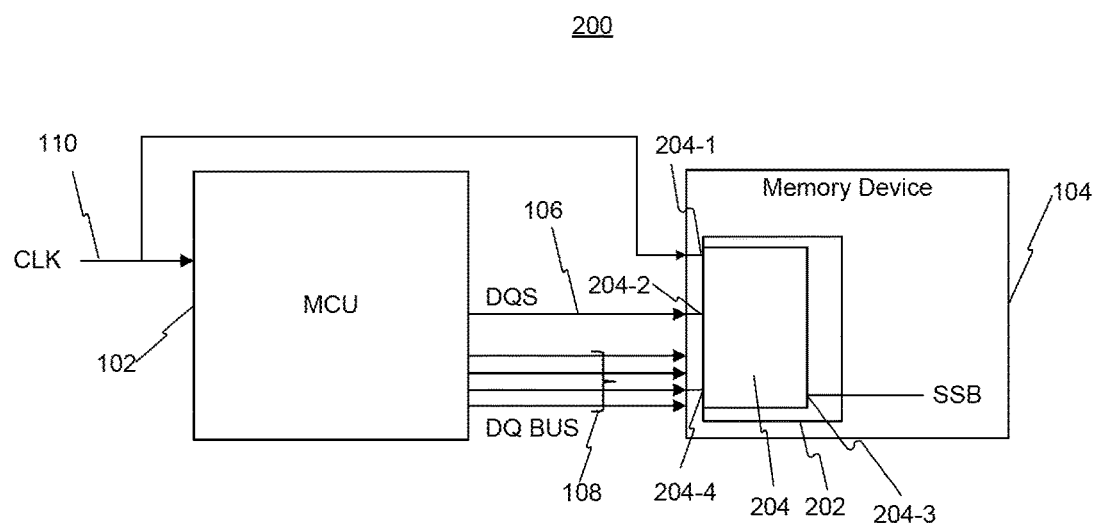
FIG. 5 shows a schematic diagram of an electronic device in which data is output from a microcontroller unit to a memory device.

FIG. 5 shows an exemplary electronic device 200. Referring to FIG. 5, in some embodiments, electronic device 200 includes a variable strobe interface 202. Variable strobe interface 202 is configured to select a DQS signal as shown in FIG. 3b or a system clock signal as shown in FIG. 4b as a strobe signal, to signal initiation or reception of a command or data by memory device 104. Referring again to FIG. 5, variable strobe interface 202 is included in memory device 104 as an interface with MCU 102. Variable strobe interface 202 includes a strobe selection module 204, which includes a first port 204-1 coupled to clock bus 110 to receive system clock signal CLK, a second port 204-2 coupled to DQS bus 106 to receive a DQS signal from MCU 102, and a third port 204-3 coupled to receive a control signal for selecting the system clock signal or the DQS signal to signal initiation of receipt of a command or data from MCU 102 via one or more conductors of DQ bus 108.

In some embodiments, strobe selection module 204 may be configured by the control signal received at third port 204-3 to accept a DQS signal to signal initiation of data or command receipt from MCU 102 and not to use a system clock signal (DQS mode). In another embodiment, strobe selection module 204 may be configured by the control signal to accept system clock signal CLK to signal initiation of data or command receipt from MCU 102 and not to use a DQS signal (system clock mode). Thus, even if memory device 104 receives both a system clock signal and a DQS signal or one of those signals, it can effectively select one of the system clock signal or the DQS to signal initiation of data or command receipt from MCU 102.

The time at which to configure strobe selection module 204 is not limited. For example, strobe selection module 204 can be configured when electronic device 200 is manufactured, e.g., by a manufacturer of memory device 104 or electronic device 200. As another example, strobe selection module 204 may have a default configuration and be programmable by a control signal after memory device 104 or electronic device 200 is sold or delivered to a user. The user may then configure strobe selection module 204 with the control signal according to the application for which memory device 104 or electronic device 200 is employed.

Referring to FIG. 5, in some embodiments the control signal to configure strobe selection module 204 may be a strobe selection bit (SSB). For example, when strobe selection module 204 receives a SSB whose value is one (SSB=1), memory device 104 can be in the DQS mode in which a DQS signal is employed to signal initiation of data or command receipt at memory device 104. Further, when strobe selection module 204 receives a SSB whose value is zero (SSB=0), memory device 104 can be in the system clock mode in which a system clock signal is employed to signal initiation of data or command receipt at memory device 104. In some embodiments, SSB can be pre-stored in non-volatile or volatile memory for use. In other embodiments, SSB may be generated by a circuit. The control signal is not limited to these examples. SSB can be any other type of digital or analog signals as long as it can effectively configure strobe selection module 204.

Referring to FIG. 5 again, in some embodiments, strobe selection module 204 includes a fourth port 204-4 coupled to the one or more conductors of DQ bus 108 to receive a command or data from MCU 102.

Although, as shown in FIG. 5, strobe selection module 204 is integrated in memory device 104, it can be separate from memory device 104 as long as it is disposed between MCU 102 and memory device 104 so that it can select a control signal to signal initiation of data or command receipt for memory device 104.

Figure 6:
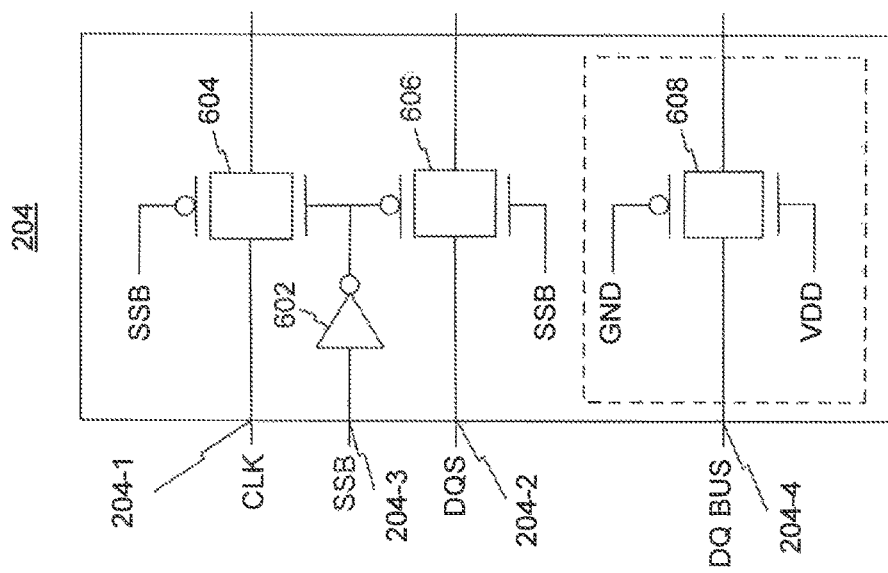
FIG. 6 shows an exemplary schematic diagram of a strobe selection module.

FIG. 6 shows an exemplary schematic diagram of strobe selection module 204. Referring to FIG. 6, strobe selection module 204 includes an inverter 602, a first transmission gate 604, and a second transmission gate 606. Inverter 602 has an input coupled to third port 204-3 that receives a SSB and an output connected to first transmission gate 604 and second transmission gate 606. As an example, when SSB=1, inverter 602 turns on second transmission gate 606 and turns off first transmission gate 604 so that a DQS signal is allowed to pass but system clock signal CLK is blocked. As another example, when SSB=0, inverter 602 turns on first transmission gate 604 and turns off second transmission gate 606 so that system clock signal CLK is allowed to pass but the DQS signal is blocked. SSB can cause either the first or the second transmission gate to be conductive. Thus, strobe selection module 204 is configured by the SSB signal to select one of the system clock signal CLK or the DQS signal to signal initiation of command or data receipt at memory device 104.

In some embodiments, as shown in FIG. 6, strobe selection module 204 optionally includes a third transmission gate 608 coupled to fourth port 204-4 to receive commands or data from one or more conductors of DQ bus 108. Third transmission gate 608 is controlled by a voltage VDD to remain in an ON state when strobe selection module 204 is receiving system clock signal CLK or a DQS signal.

Although exemplary embodiments have been shown and described, it will be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A memory device comprising a variable strobe interface configured to select one of a data queue strobe signal or an external system clock signal to signal initiation of data receipt at the memory device, the external system clock signal being external to the memory device, wherein the variable strobe interface includes a strobe selection module, the strobe selection module including a first port coupled to receive the external system clock signal, a second port coupled to receive the data queue strobe signal, and a third port coupled to receive a control signal for selecting the external system clock signal or the data queue strobe signal, and the strobe selection module includes a first transmission gate coupled to the first port to receive the external system clock signal, a second transmission gate coupled to the second port to receive the data queue strobe signal, and an inverter coupled to the third port, an output of the inverter coupled to the first and second transmission gates, an input of the inverter for receiving the control signal to cause either the first or the second transmission gate to be conductive.

2. The memory device of claim 1, wherein the strobe selection module further includes a fourth port coupled to one or more conductors of a data queue bus to receive the data.

3. The memory device of claim 2, wherein the strobe selection module further includes a third transmission gate coupled to the fourth port to receive the data.

4. The memory device of claim 1, wherein the control signal includes a strobe selection bit.

5. An electronic device, comprising:
a controller;
a memory device;
a data queue strobe bus disposed between the controller and the memory device;
one or more conductors of a data queue bus disposed between the controller and the memory device;
a clock bus coupled to the controller and the memory device; and
a variable strobe interface disposed between the controller and the memory device and coupled to the data queue strobe bus and the clock bus, the variable strobe interface being configured to select one of a data queue strobe signal transmitted on the data queue strobe bus or an external system clock signal transmitted on the clock bus to signal initiation of data receipt at the memory device on one or more of the conductors of the data queue bus, the external system clock signal being external to the memory device,
wherein the variable strobe interface includes a strobe selection module, the strobe selection module including a first port coupled to receive the external system clock signal, a second port coupled to receive the data queue strobe signal, and a third port coupled to receive a control signal for selecting the external system clock signal or the data queue strobe signal, and
the strobe selection module includes a first transmission gate coupled to the first port to receive the external system clock signal, a second transmission gate coupled to the second port to receive the data queue strobe signal, and an inverter coupled to the third port, an output of the inverter coupled to the first and second transmission gates, an input of the inverter for receiving the control signal to cause either the first or the second transmission gate to be conductive.

6. The electronic device of claim 5, wherein the strobe selection module further includes a fourth port coupled to one or more of the conductors of the data queue bus to receive the data.

7. The electronic device of claim 6, wherein the strobe selection module further includes a third transmission gate coupled to the fourth port to receive the data.

8. The electronic device of claim 5, wherein the control signal includes a strobe selection bit.

* * * * *